(12) United States Patent
Chang

(10) Patent No.: US 9,711,369 B2
(45) Date of Patent: Jul. 18, 2017

(54) METHOD FOR FORMING PATTERNS WITH SHARP JOGS

(71) Applicant: Taiwan Semiconductor Manufacturing Company, Ltd., Hsin-Chu (TW)

(72) Inventor: Shih-Ming Chang, Hsinchu County (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 41 days.

(21) Appl. No.: 14/659,264

(22) Filed: Mar. 16, 2015

(65) Prior Publication Data
US 2016/0276164 A1    Sep. 22, 2016

(51) Int. Cl.
| H01L 21/308 | (2006.01) |
| H01L 21/311 | (2006.01) |
| H01L 21/033 | (2006.01) |
| H01L 21/3213 | (2006.01) |

(52) U.S. Cl.
CPC ...... *H01L 21/3086* (2013.01); *H01L 21/0337* (2013.01); *H01L 21/31144* (2013.01); *H01L 21/32139* (2013.01)

(58) Field of Classification Search
CPC .......... H01L 21/3086; H01L 21/32139; H01L 21/0337; H01L 21/31144; H01L 21/308
See application file for complete search history.

(56) References Cited

U.S. PATENT DOCUMENTS

| 2,290,317 | A |   | 7/1942  | Deakin |
| 2,352,188 | A |   | 6/1944  | Farrell |
| 4,577,744 | A |   | 3/1986  | Doucet |
| 4,969,549 | A |   | 11/1990 | Eglise |
| 6,184,128 | B1 |  | 2/2001  | Wang et al. |
| 6,328,902 | B1 |  | 12/2001 | Hantschel et al. |
| 6,368,979 | B1 |  | 4/2002  | Wang et al. |
| 6,383,952 | B1 | * | 5/2002 | Subramanian ...... H01L 21/0271 257/E21.024 |

(Continued)

FOREIGN PATENT DOCUMENTS

| JP | 2006-189986 | 7/2006 |
| JP | 2005-293097 | 10/2015 |

OTHER PUBLICATIONS

U.S. Appl. No. 14/210,032, filed Mar. 13, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 32 pages of text, 16 pages of drawings.

(Continued)

*Primary Examiner* — Selim Ahmed
(74) *Attorney, Agent, or Firm* — Haynes and Boone, LLP

(57) ABSTRACT

The present disclosure provides a method for forming patterns in a semiconductor device. The method includes forming a main pattern on a substrate; forming a spacer on sidewalls of the main pattern; forming a cut pattern having an opening by a first lithography process; and performing a cut process to selectively remove portions of the spacer within the opening of the cut pattern while the main pattern remains unetched, thereby defining a circuit pattern by the main pattern and the spacer. The circuit pattern includes a sharp jog.

20 Claims, 20 Drawing Sheets

(56) References Cited

U.S. PATENT DOCUMENTS

| | | |
|---|---|---|
| 6,440,858 B1 | 8/2002 | Canale et al. |
| 6,472,315 B2 | 10/2002 | Nguyen et al. |
| 6,514,852 B2 | 2/2003 | Usami |
| 6,534,809 B2 | 3/2003 | Moise et al. |
| 6,550,600 B2 | 4/2003 | Faes et al. |
| 6,605,545 B2 | 8/2003 | Wang |
| 6,835,662 B1 | 12/2004 | Erhardt et al. |
| 6,930,036 B2 | 8/2005 | Usami |
| 7,057,286 B2 | 6/2006 | Usami |
| 7,074,527 B2 | 7/2006 | Lu et al. |
| 8,039,179 B2 | 10/2011 | Shieh et al. |
| 8,202,681 B2 | 6/2012 | Lin et al. |
| 8,609,495 B2 | 12/2013 | Gan et al. |
| 8,647,521 B2 | 2/2014 | Jung |
| 8,728,332 B2 | 5/2014 | Lin et al. |
| 8,822,243 B2 | 9/2014 | Yan et al. |
| 8,835,323 B1 | 9/2014 | Shieh et al. |
| 8,987,142 B2 | 3/2015 | Lee et al. |
| 9,159,560 B2 | 10/2015 | Seo |
| 9,245,763 B2 | 1/2016 | Chang |
| 9,293,341 B2 | 3/2016 | Chang |
| 2002/0187629 A1 | 12/2002 | Huang et al. |
| 2005/0064299 A1 | 3/2005 | Lu et al. |
| 2005/0208742 A1 | 9/2005 | America et al. |
| 2006/0091468 A1 | 5/2006 | Liaw |
| 2006/0211260 A1 | 9/2006 | Tran et al. |
| 2010/0224942 A1* | 9/2010 | Lim ................. H01L 21/28052 257/384 |
| 2011/0281208 A1 | 11/2011 | Lin et al. |
| 2012/0225388 A1 | 9/2012 | Umatate et al. |
| 2012/0278776 A1 | 11/2012 | Lei et al. |
| 2013/0105918 A1* | 5/2013 | Mieno ................. H01L 21/0228 257/410 |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2015/0262830 A1 | 9/2015 | Chang |
| 2015/0380256 A1 | 12/2015 | Chang |
| 2015/0380259 A1 | 12/2015 | Chang |
| 2015/0380261 A1 | 12/2015 | Chang |

OTHER PUBLICATIONS

U.S. Appl. No. 14/334,904, filed Jul. 18, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 40 pages of text, 19 pages of drawings.

U.S. Appl. No. 14/334,958, filed Jul. 18, 2014, by inventors Shih-Ming Chang for "Mechanisms for Forming Patterns Using Multiple Lithography Processes," 30 pages of text, 11 pages of drawings.

U.S. Appl. No. 14/457,282, filed Aug. 12, 2014, by inventors Shih-Ming Chang for "Mechanisms for Forming Patterns Using Multiple Lithography Processes," 29 pages of text, 12 pages of drawings.

* cited by examiner

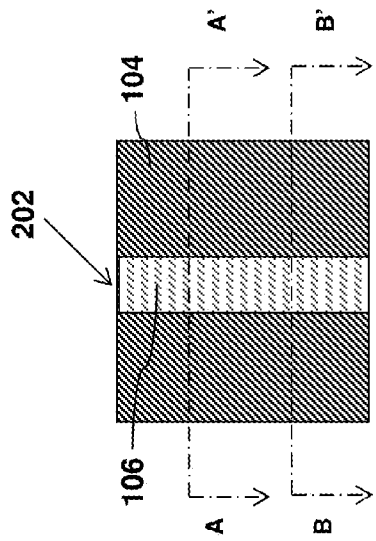
FIG. 3A
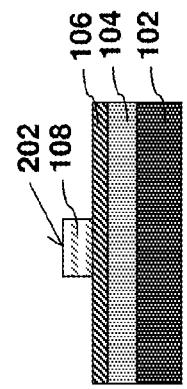
FIG. 3B
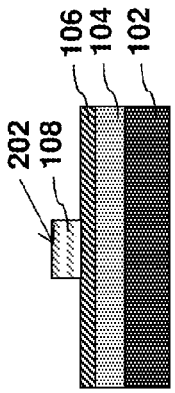
FIG. 3C
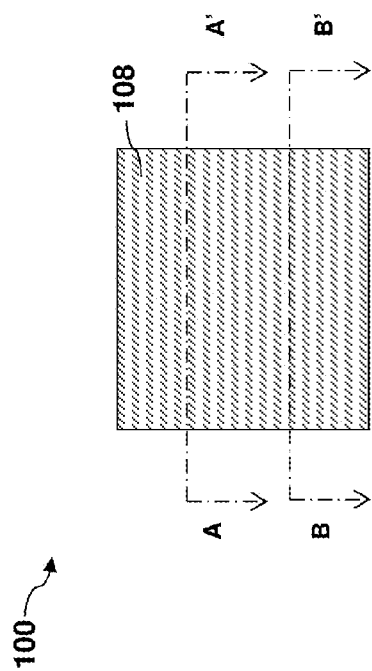
FIG. 2A
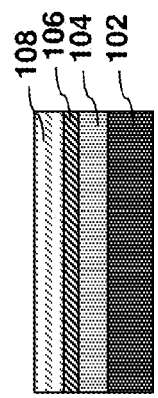
FIG. 2B
FIG. 2C

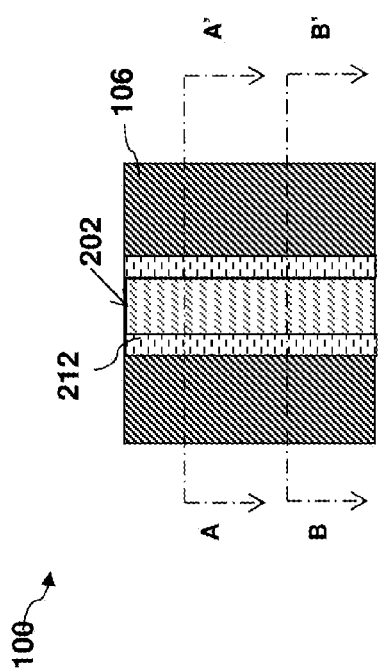
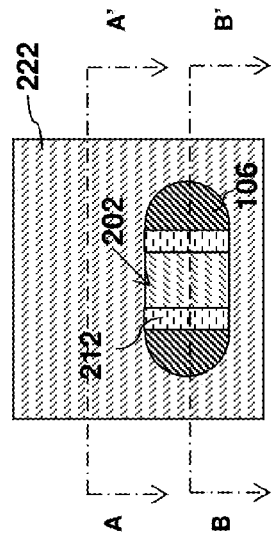
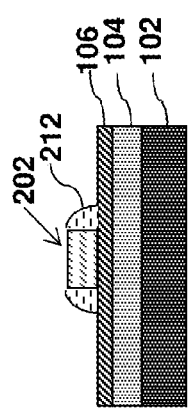
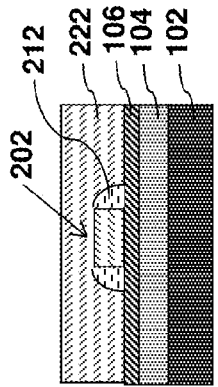
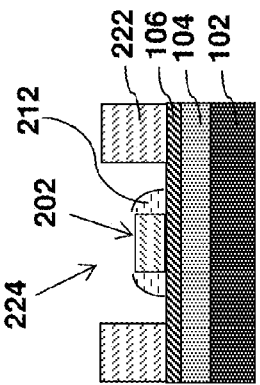
FIG. 4A
FIG. 4B
FIG. 4C
FIG. 5A
FIG. 5B
FIG. 5C

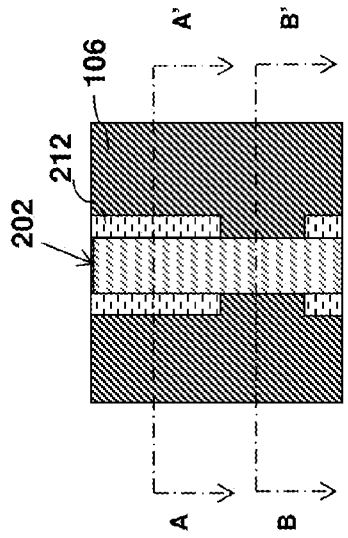
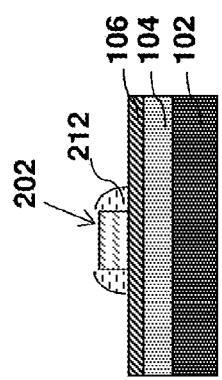
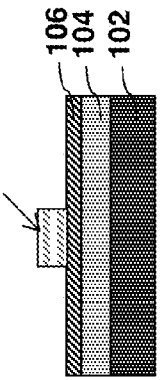
FIG. 7A
FIG. 7B
FIG. 7C
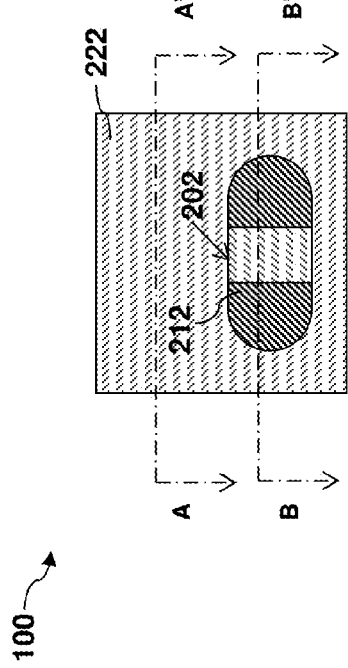
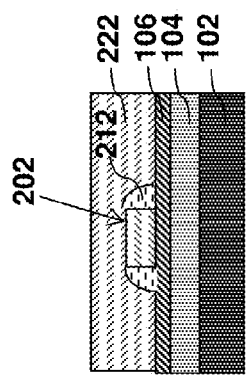
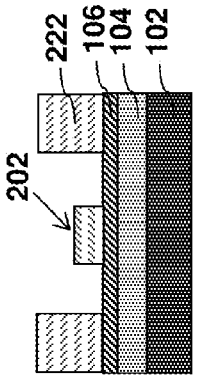
FIG. 6A
FIG. 6B
FIG. 6C

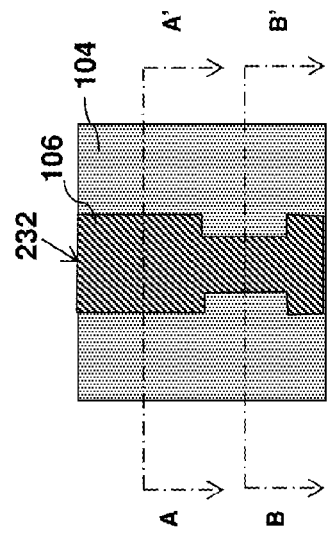
FIG. 8A
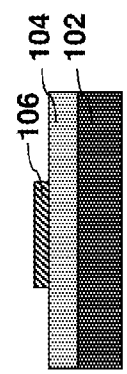
FIG. 8B
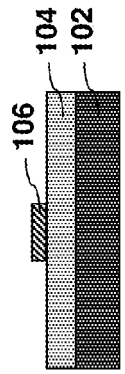
FIG. 8C
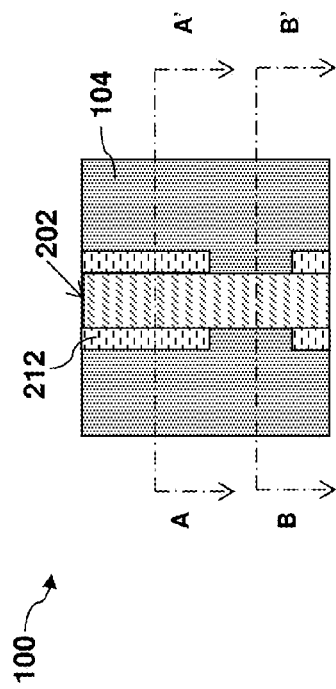
FIG. 9A
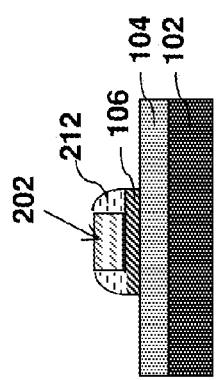
FIG. 9B
FIG. 9C

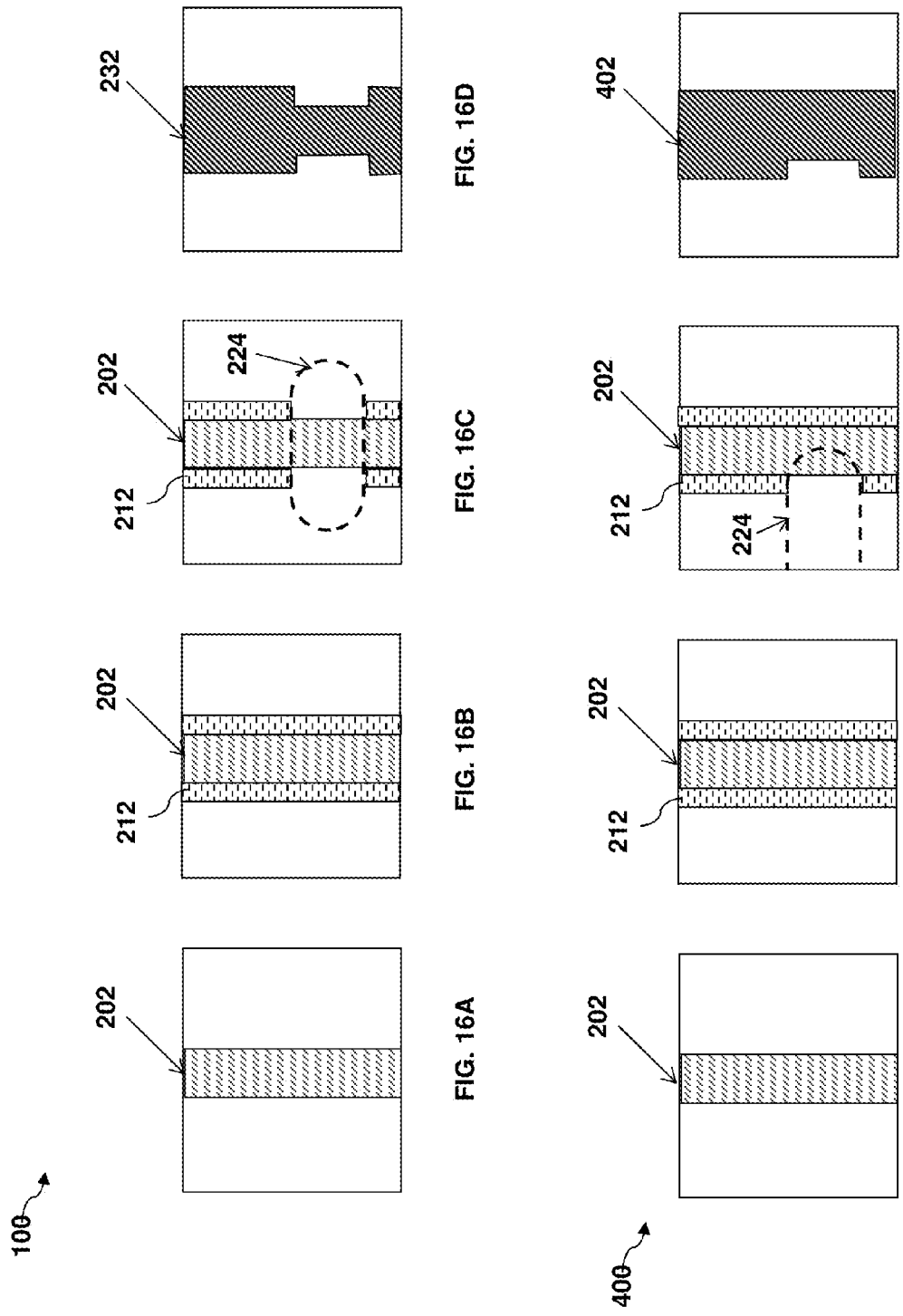

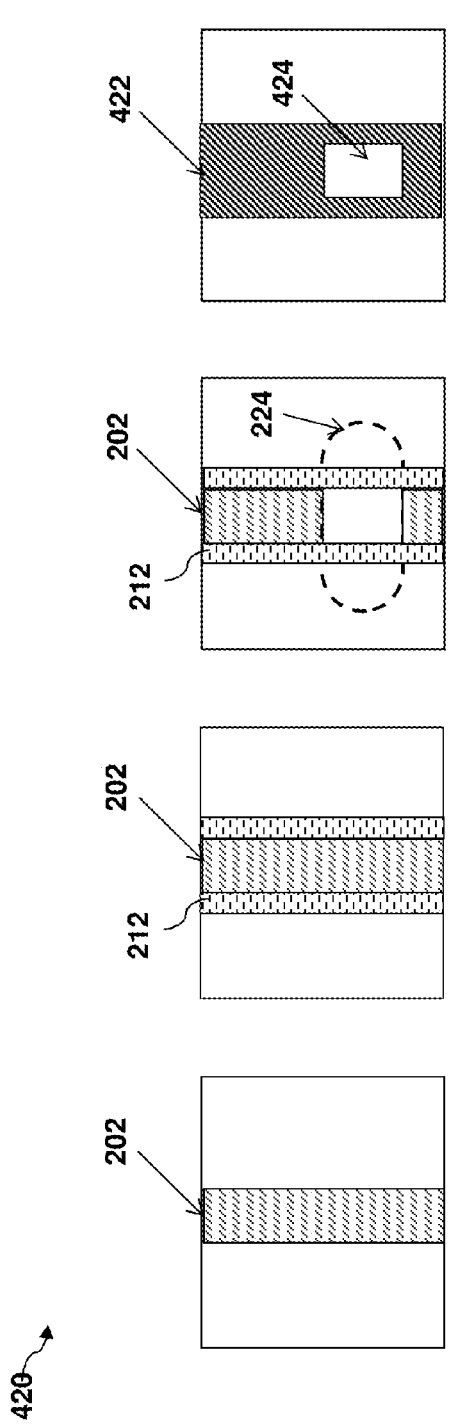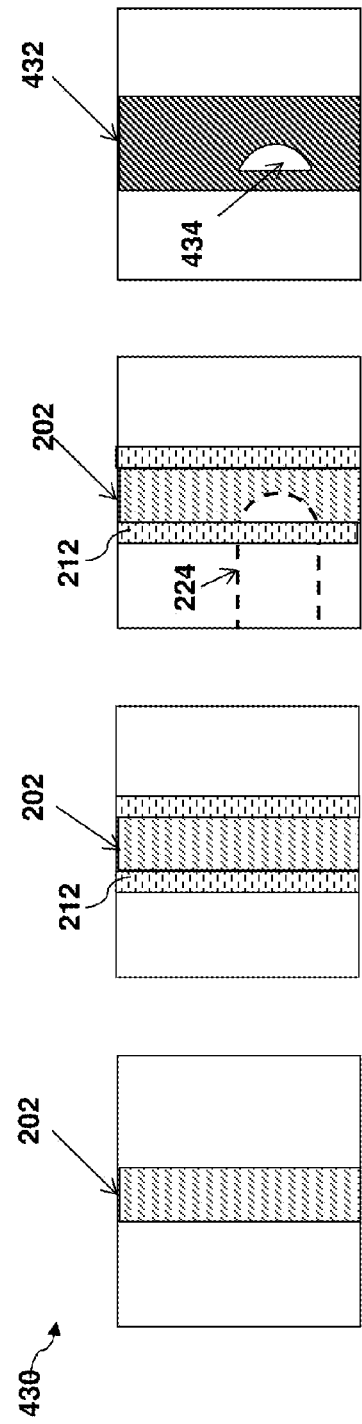

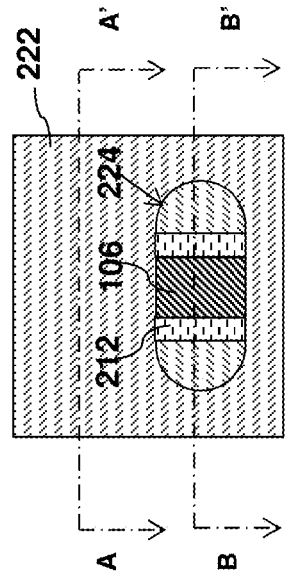
FIG. 23A
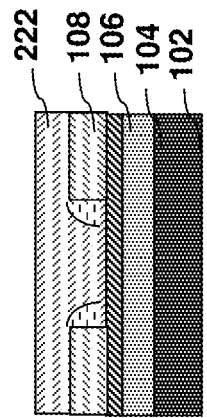
FIG. 23B
FIG. 23C
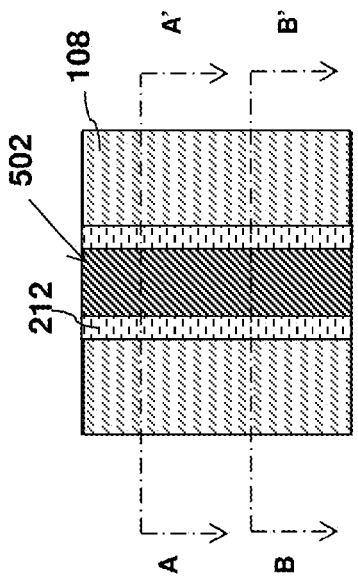
FIG. 24A
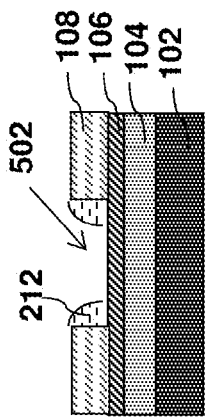
FIG. 24B
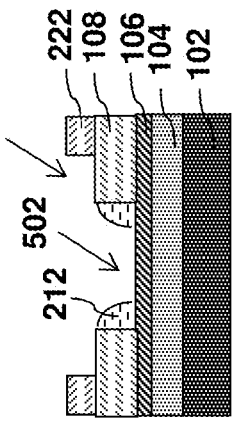
FIG. 24C

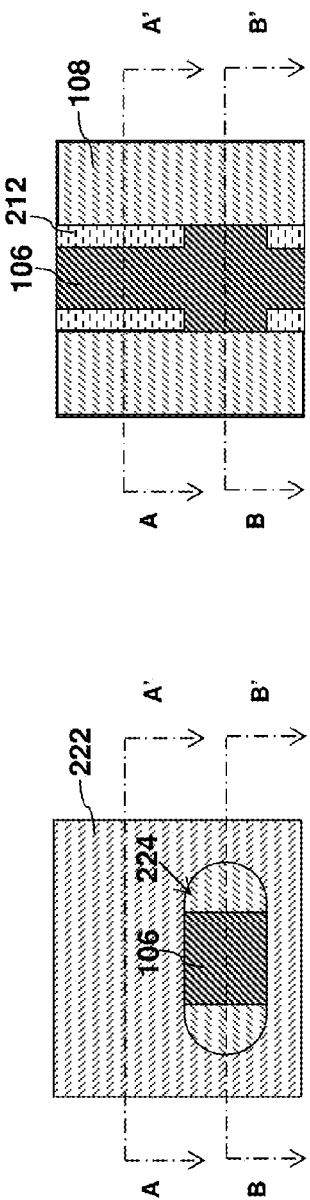
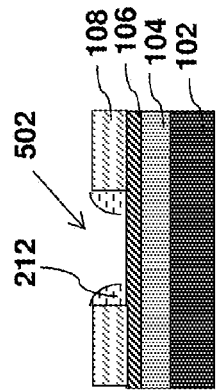
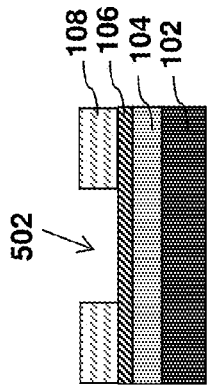
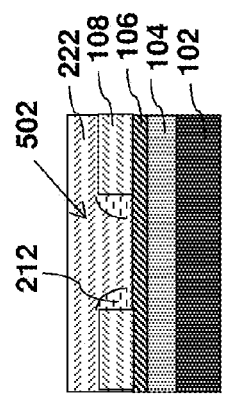
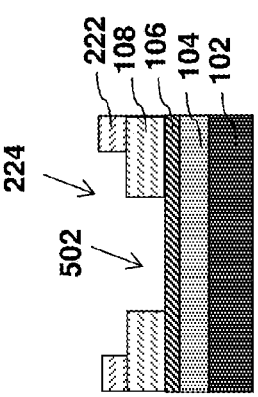

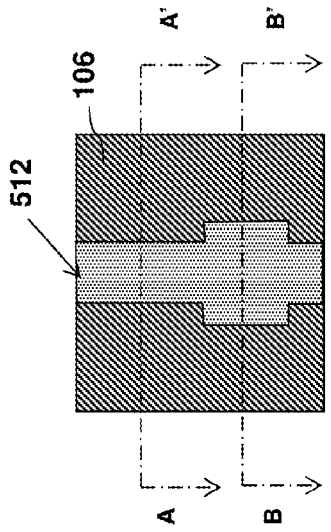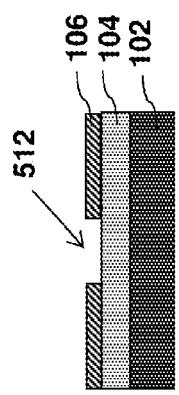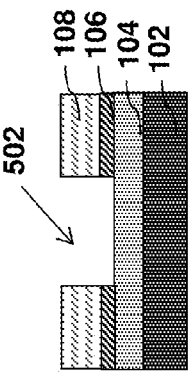
FIG. 28A   FIG. 28B   FIG. 28C
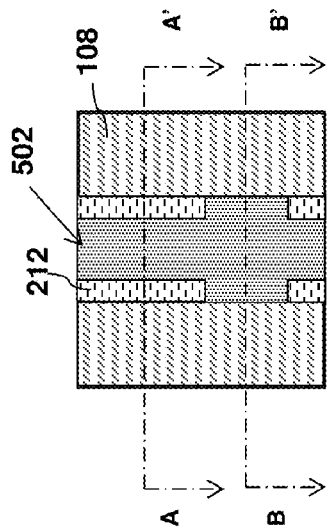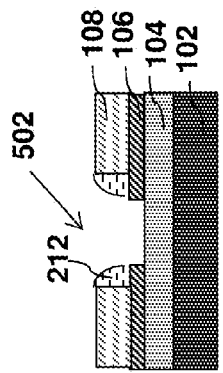
FIG. 27A   FIG. 27B   FIG. 27C

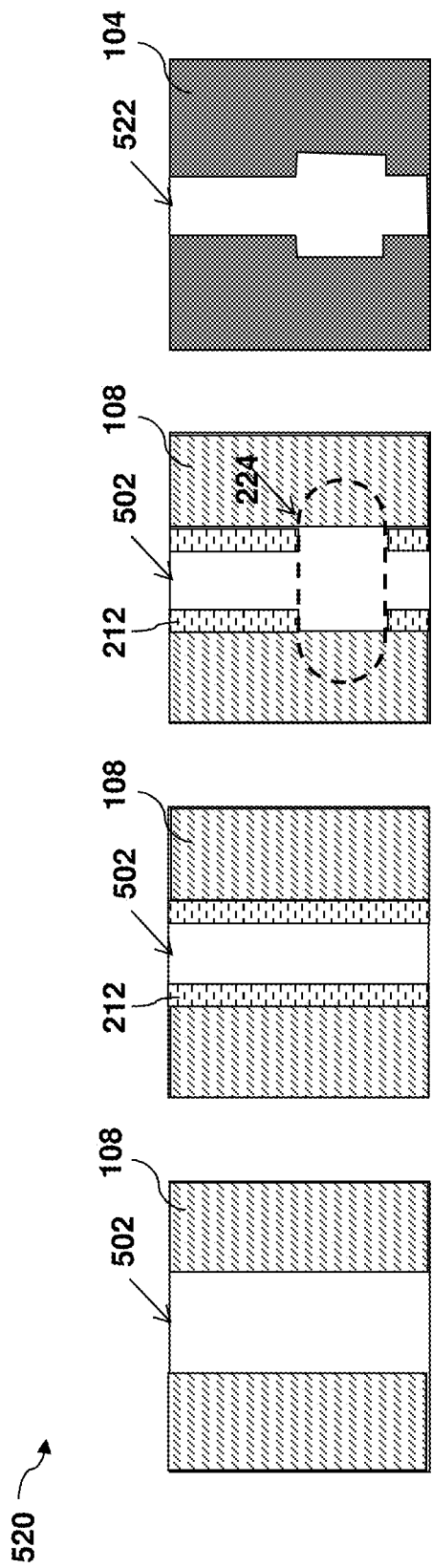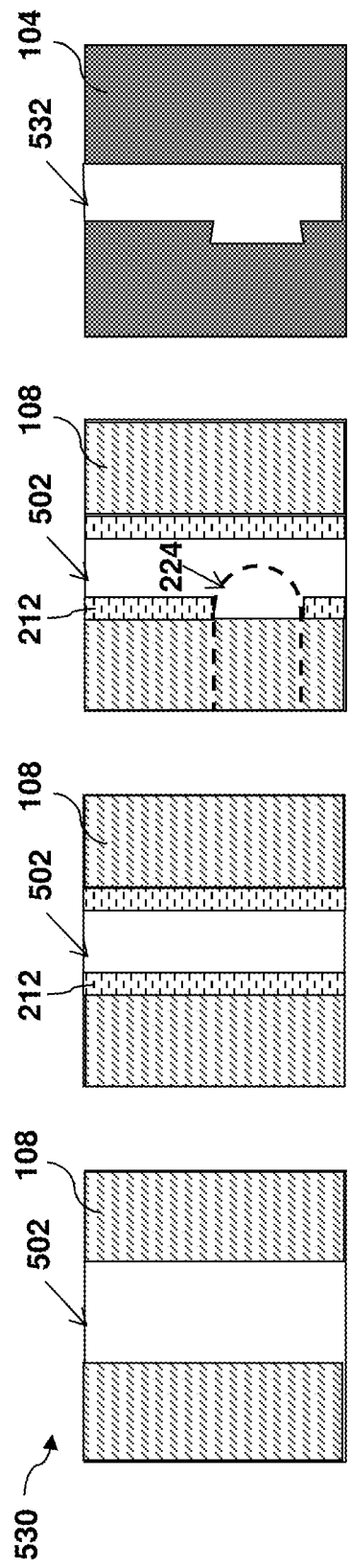

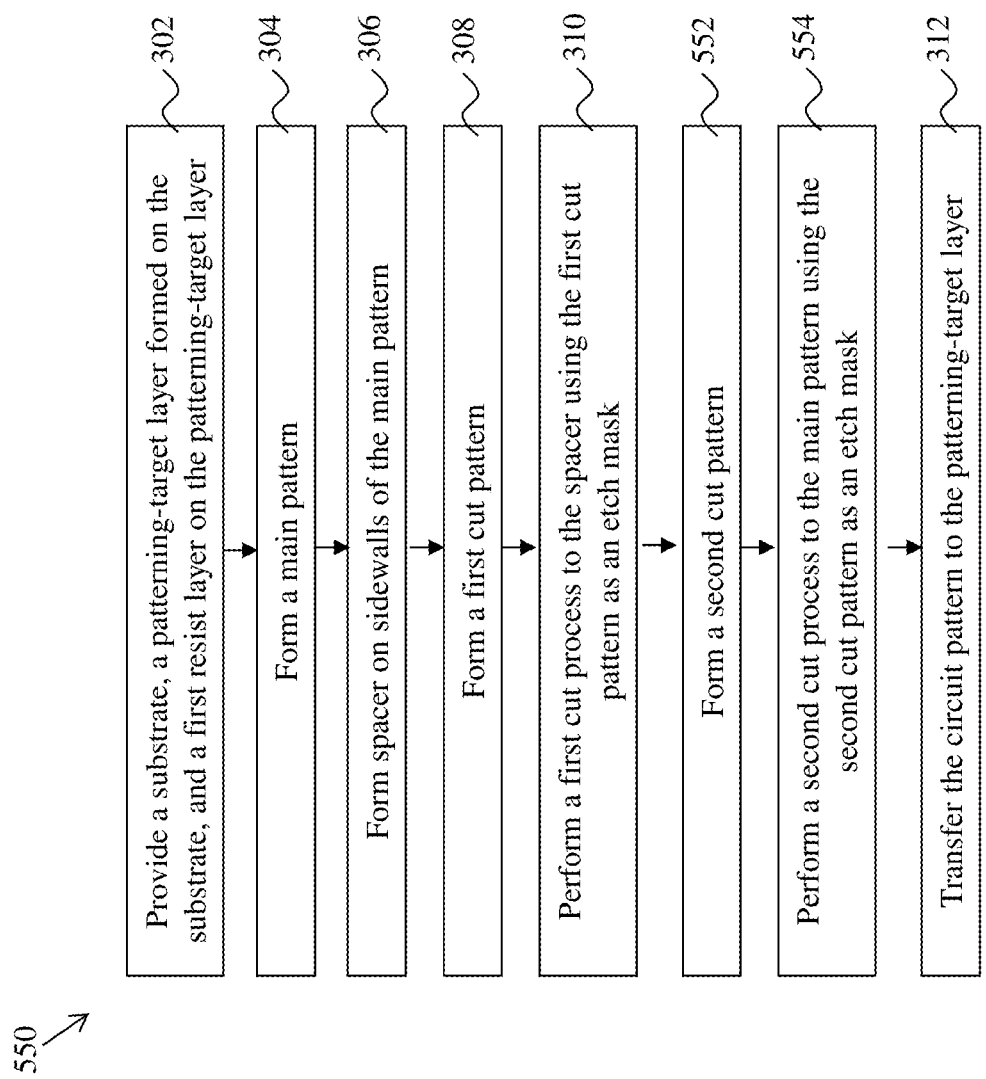

METHOD FOR FORMING PATTERNS WITH SHARP JOGS

The present disclosure is related to the following commonly-assigned patent applications, the entire disclosures of which are incorporated herein by reference: U.S. patent application Ser. No. 14/334,958 filed on Jul. 18, 2014, entitled "Mechanisms for Forming Patterns Using Multiple Lithography Processes"; U.S. patent application Ser. No. 14/457,282 filed on Aug. 12, 2014, entitled "Mechanisms for Forming Patterns Using Multiple Lithography Processes", now issued U.S. Pat. No. 9,293,341; U.S. patent application Ser. No. 14/210,032 filed on Mar. 13, 2014, entitled "Mechanisms for Forming Patterns Using Multiple Lithography Processes", now issued U.S. Pat. No. 9,245,763; and U.S. patent application Ser. No. 14/334,904 filed on Jul. 18, 2014, entitled "Mechanisms for Forming Patterns Using Multiple Lithography Processes".

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A and 10A are top views of a semiconductor structure at various fabrication stages constructed by the method of FIG. 15, in accordance with some embodiments.

FIGS. 2B, 3B, 4B, 5B, 6B, 7B, 8B, 9B and 10B are cross sectional views of the semiconductor structure along the dash lines AA' of FIGS. 2A, 3A, 4A, 5A, 6A, 7A, 8A, 9A and 10A respectively, in accordance with some embodiments.

FIGS. 2C, 3C, 4C, 5C, 6C, 7C, 8C, 9C and 10C are cross sectional views of the semiconductor structure along the dash lines BB' of FIGS. 2A, 3A, 4A, 5A, 6A, 7A, 8A, 9A and 10A respectively, in accordance with some embodiments.

FIGS. 16A, 16B, 16C and 16D are top views of the semiconductor structure in various fabrication stages, constructed in accordance with some embodiments.

FIGS. 17A, 17B, 17C and 17D are top views of the semiconductor structure in various fabrication stages, constructed in accordance with some embodiments.

FIGS. 19A, 19B, 19C and 19D are top views of the semiconductor structure in various fabrication stages, constructed in accordance with some embodiments.

FIGS. 20A, 20B, 20C and 20D are top views of the semiconductor structure in various fabrication stages, constructed in accordance with some embodiments.

FIGS. 21A, 22A, 23A, 24A, 25A, 26A, 27A, 28A, and 29A are top views of a semiconductor structure at various fabrication stages constructed by the method of FIG. 15, in accordance with some embodiments.

FIGS. 21B, 22B, 23B, 24B, 25B, 26B, 27B, 28B and 29B are cross sectional views of the semiconductor structure along the dash lines AA' of FIGS. 21A, 22A, 23A, 24A, 25A, 26A, 27A, 28A, and 29A respectively, in accordance with some embodiments.

FIGS. 21C, 22C, 23C, 24C, 25C, 26C, 27C, 28C and 29C are cross sectional views of the semiconductor structure along the dash lines BB' of FIGS. 21A, 22A, 23A, 24A, 25A, 26A, 27A, 28A, and 29A respectively, in accordance with some embodiments.

FIGS. 30A, 30B, 30C and 30D are top views of the semiconductor structure in various fabrication stages, constructed in accordance with some embodiments.

FIGS. 31A, 31B, 31C and 31D are top views of the semiconductor structure in various fabrication stages, constructed in accordance with some embodiments.

FIG. 35 is a flowchart showing a method of forming a circuit pattern in the semiconductor structure using multiple lithography processes, in accordance with some embodiments.

DETAILED DESCRIPTION

Figure 1:
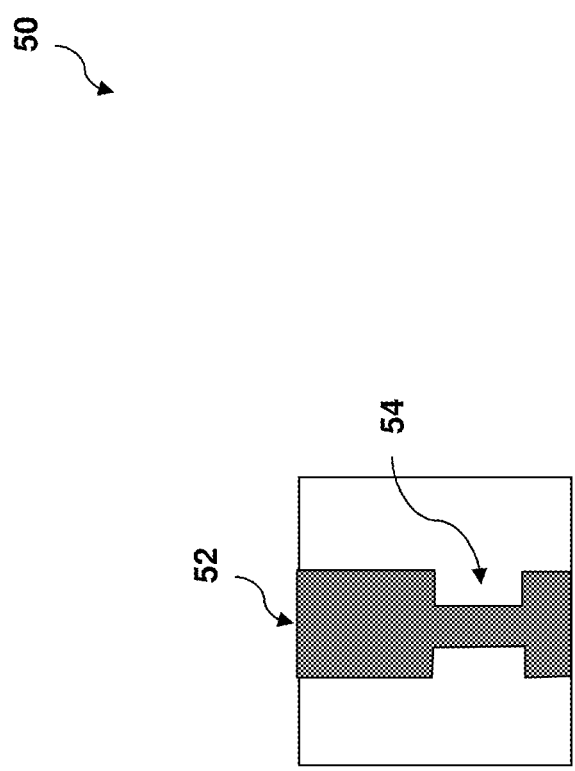
FIG. 1 is a top view of an integrated circuit pattern constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Due to the limitations from the optics, resist materials, developing and/or etching techniques during the lithography patterning process, the developed pattern may not be able to include a feature with a size under the minimum constraints, such as a minimum line width. The developed pattern may also not be able to have dense feature(s) that are disposed from an adjacent feature for less than about a minimum pitch value. As obtained from a single lithography process, the developed pattern may have limitations on the complexity of the shapes. In addition, after exposing and developing, the pattern may have "rounding issues", where the edges and/or the corners of the features may appear to be round and/or unclear, instead of being sharp and clear as expected. In some embodiments, the mechanisms discussed in the present disclosure can solve the above listed problems, and provide one or more semiconductor structures having complex shapes and free of the "rounding issues".

FIG. 1 is a top view of an integrated circuit pattern (or IC pattern) 50 to be formed on a semiconductor substrate, such as a semiconductor wafer. The IC pattern 50 includes a line feature 52 having sharp jogs 54. In other words, the line feature 52 has a neck portion with a different dimension. In the present example, the line feature 52 has symmetric dents from both sides in the neck portion. The IC pattern 50 is provided to illustrate the disclosed method and is not intended to limit the scope of the disclosure. The existing methods either includes multiple patterning operations (such as three lithography patterning) with high fabrication cost or ends up with rounding corners with degraded resolution and accordingly degraded device quality/performance. The disclosed method is described below with references to FIGS. 2A, 2B and 2C through 10A, 10B and 10C in accordance with some embodiments.

As illustrated in FIGS. 2A, 2B and 2C, a substrate 102, a patterning-target layer 104, and a first hard mask layer 106, a first resist layer 108 are provided in a semiconductor structure (also referred to as workpiece) 100. In some embodiments, the substrate 102 is a semiconductor substrate, such as a semiconductor wafer. The substrate 102 may include silicon in a crystalline structure. In some embodiments, the substrate 102 may include other elementary semiconductor, such as germanium; a compound semiconductor including silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as shallow trench isolation (STI). The substrate 102 may further include various material layers, such as gate material layers.

Referring to FIGS. 2B and 2C, the patterning-target layer 104 is formed over the substrate 102. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Still referring to FIGS. 2B and 2C, a first hard mask layer 106 may be formed over the patterning-target layer 104. In some embodiments, the first hard mask layer 106 is a dielectric material layer to provide etch resistance and to function as an etch mask during an etching process. For example, the etching process can etch an underlying material layer through the openings of the first hard mask layer such that the openings are transferred to the underlying material layer. In some embodiments, the first hard mask layer 106 includes silicon oxide, silicon nitride, silicon oxynitride, or other suitable material. In some embodiments, the hard mask layer 106 includes titanium nitride (TiN). In some embodiments, the hard mask layer 106 has a thickness in a range from about 5 nm to about 50 nm. In some embodiments, the hard mask layer 106 is formed using one or more processes selected from the group consisting of CVD, PVD, ALD, spin-on method, and a combination thereof.

Still referring to FIGS. 2B and 2C, in order to pattern the pattering-target layer 104, the first resist layer 108 is formed over the patterning-target layer 104 (and the first hard mask layer 106 as well if present). The first resist layer 108 may be formed by a suitable technique, such as spin-on coating. In some embodiments, the first resist layer 108 is a photoresist layer including chemicals that are sensitive to light, such as UV light. In some embodiments, the first resist layer 108 can also be an electron-beam sensitive layer. In some embodiments, the first resist layer 108 is formed using a spin-on coating method. In some embodiments, the first resist layer 108 includes one or more organic polymer materials. In some embodiments, the first resist layer 108 has a thickness in a range from about 10 nm to about 100 nm.

Referring to FIGS. 3A, 3B and 3C, a lithography process is performed to the first resist layer 108 to form a main pattern 202. In some embodiments, the main pattern 202 includes one or more lines 202 as shown in FIG. 3A. In some embodiments, the main pattern 202 is formed in the first resist layer 108 using a lithography process. In some embodiments, the lithography process starts from exposing the first resist layer 108 to a light source using a photomask (reticle or mask) having the main pattern 202. The lithography process also includes performing post-exposure bake processes, and developing the first resist layer 108 to form a patterned first resist layer, so that the main pattern 202 is defined in the first resist layer 108 as shown in FIGS. 3A-3C. In some embodiments, the main pattern 202 may include any other suitable features that can be formed using a lithography process. In some embodiments, a lithography process may further include other operations, such as soft baking and/or hard baking. In some embodiments, the lithography process may alternatively employ other suitable technology, such as electron-beam lithography.

Figure 11:
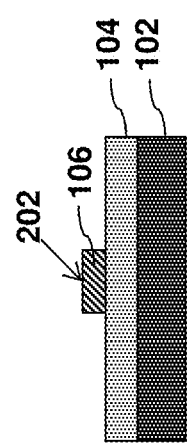

In the present embodiment, the main pattern 202 is defined in the patterned first resist layer 108. In other embodiments, the main pattern 202 may be transferred to and defined in the first hard mask 106 by an etch process using the patterned first resist layer 108 as an etch mask. In this case, the first resist layer 108 may be removed after the main pattern 202 is transferred to the first hard mask 106, as illustrated in FIG. 11. In the following description, when the main pattern 202 is referred, it may be defined in the first resist layer 108 in some embodiments or alternatively defined in the first hard mask 106 in other embodiments.

Figure 12:
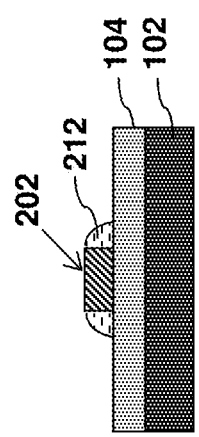

Referring to FIGS. 4A-4C, a spacer 212 is formed on the sidewalls of the main pattern 202. In some embodiments, the material of the spacer 212 may include any suitable semiconductor, semiconductor oxide, semiconductor nitride, semiconductor oxynitride, other dielectric, and/or other suitable material and may be selected to have different etchant sensitivity than the first hard mask layer 106 and the resist layer 108. For example, in an embodiment with a silicon oxide material layer 106, the spacer 212 fins include silicon nitride. In some embodiments when the main pattern 202 is defined in the first hard mask 106, the spacer 212 is formed on the sidewalls of the main pattern 202 defined in the first hard mask 106. The semiconductor structure 100 illustrated in FIGS. 4B and 4C is replaced by the semiconductor structure 100 illustrated in FIG. 12.

One technique for forming the spacer 212 on the sidewalls of the main pattern 202 without substantial spacer material remaining on the horizontal surfaces of the workpiece 100 includes deposition and anisotropic etching. In furtherance of the embodiments, a spacer material is deposited on the workpiece 100 by any suitable process including CVD, CVD, plasma-enhanced CVD (PECVD), and/or other suitable deposition techniques. Conformal deposition techniques may be used, despite depositing material on the horizontal surfaces. To remove this extraneous material, an anisotropic etching such as a dry or plasma etching, may be performed to etch back and remove those portions of the spacer material deposited on the horizontal surfaces of the main pattern 202 and the first hard mask layer 106. In this way, only those portions of the spacer 212 deposited on the vertical surfaces of the main pattern 202 remain. In various examples, the deposition thickness and the etching technique are tuned to control the horizontal thickness of the spacer 212. The thickness of the spacer 212 is correlated to the jog dimension of the main features to be formed in the patterning target material layer 104.

Alternatively, the spacer 212 may be formed by other suitable technique. In some embodiments, the spacer 212 is formed by a direct self-assembly (DSA) process. The DSA uses a block copolymer that has two type of monomers (such as monomers A and B) linked into linear polymer chains each having a segment of only monomer A and another segment of only monomer B. During a proper condition (such as during a thermal process), the block copolymer will automatically reorganize to form a block A and block B in a certain pattern, which is associated with the composition of the copolymer and the condition of the substrate (such as the surface pattern on the substrate). For example, the main pattern 202 constrains the pattern. In some embodiments, the DSA process may use a block copolymer, such as poly (styrene)-block-poly(methyl methacrylate) or PS-b-PMMA. In some embodiments, the procedure to form the spacer 212 by DSA includes coating a block copolymer solution on the workpiece 100; performing a thermal baking process such that the block copolymer is self-assembled to a block pattern; and performing an etching process to selectively remove one type (such as block A) while another type (such as block B) remains. During the thermal baking process, the block pattern is self-aligned with the main pattern 202. After the etching process, the spacer 212 is formed on the sidewalls of the main pattern 202. The horizontal thickness of the spacer 212 can be tuned by tuning the composition of the block copolymer and/or by a trimming process.

In some other embodiments, the spacer 212 is formed by resolution enhancement lithography by assist of chemical shrink (RELACS). The method to form the spacer 212 using RELACS includes coating a polymer on the workpiece 100 and performing an etching process to the polymer, thereby forming the spacer 212 on the sidewalls of the main pattern 202. For example, a method used in U.S. Pat. No. 6,383,952 may be used for the purpose and herein incorporated by reference in its entirety.

Referring to FIGS. 5A-5C, a second resist layer 222 is formed on the workpiece 100 and defines a cut pattern. The second resist layer 222 is formed by a photolithography process, such as a photolithography method similar to that used to form the patterned first resist layer 108. In one example, the method includes resist spin-on coating, exposing, post-exposure baking and developing. The cut pattern includes a cut feature 224, which is a trench (opening), defining a region to be cut (modified) by a cut process.

In some embodiments, the main pattern 202 is defined in the patterned first resist layer 108. The spacer 212 is formed on the sidewalls of the patterned first resist layer, and the second resist layer 222 is formed while the patterned first resist layer 108 is still present. Since the first resist layer 202 is present, the second resist layer 222 is different from the first resist layer 108. For example, the second resist layer 222 can be developed by a developing solution that will not develop the first resist layer.

Figure 13:
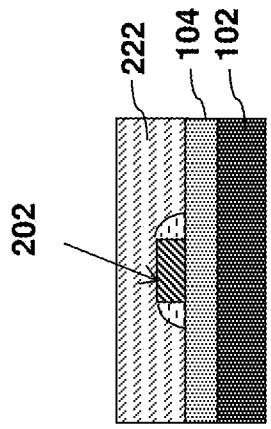
FIGS. 11-14 are cross sectional views of the semiconductor structure constructed in accordance with some embodiments.
Figure 14:
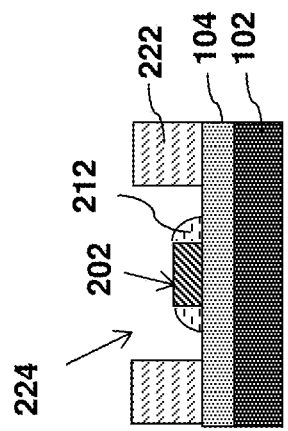

In some other embodiments as noted above, the main pattern 202 is defined in the first hard mask 106 and the spacer 212 is formed on the sidewalls of the main pattern 202 (that is defined in the first hard mask 106). In this case, the second resist layer 222 is formed on the patterning-target layer 104 to define the cut feature, as illustrated in FIGS. 13 and 14 (corresponding to FIGS. 5B and 5C, respectively).

Referring to FIGS. 6A-6C, a cut process is applied to remove the portions of the spacer 212 within the opening of the second resist layer 222. In other words, a cut process includes an etching process applied to cut (remove) portions of the spacer 212 defined within the cut feature 224. The etching process may include a wet etch, a dry etch, or any suitable etch with proper etch selectivity such that it selectively removes the spacer 212 using the second resist layer 222 and the main pattern 202 as a collective mask while the main pattern 202 remains unetched.

Referring to FIGS. 7A-7C, the second resist layer 222 is removed by a proper technique. In some embodiments, the second resist layer 222 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof.

Referring to FIGS. 8A-8C, an etching process is applied to etch the first hard mask 106 using the spacer 212 and the main pattern 202 as an etching mask, thereby forming a final circuit pattern 232 in the first hard mask 106. In some embodiments, the regions that are not covered by the main pattern 202 and the spacer 212 are removed using one or more etching processes, leaving the region(s) corresponding to the circuit pattern (collectively defined by both main pattern 202 and the spacer 212 as illustrated in FIG. 8A) remain in the first hard mask 106. In some embodiments, the one or more etching processes include a selective dry etch process, such as a plasma etching process, a selective wet etching process, or a combination thereof. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Referring to FIGS. 9A-9C, thereafter, the first resist layer 108 and the spacer 212 are removed by an etching procedure that includes one or more etching processes. In some embodiments, the etching procedure includes a first etching process to selectively etch the main pattern 202 and a second etching process to selectively etch the spacer 212 in either sequence. In some embodiments, the etching procedure may include one etching process that is tuned to selectively etch both the main pattern 202 and the spacer 212. In some embodiments, the main pattern 202 is defined in the first resist layer 108 and the removal of the main pattern 202 is by a wet stripping process or a plasma ashing process.

Figure 10A:
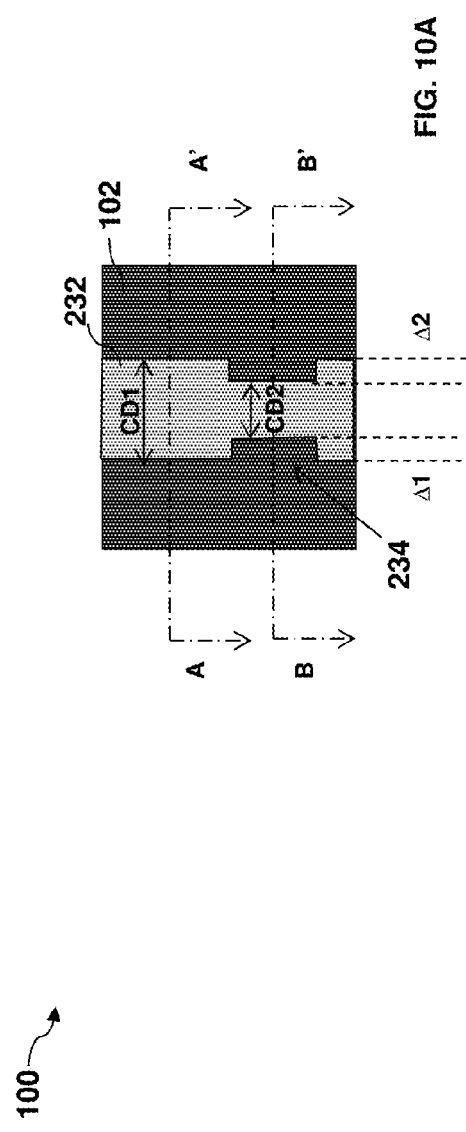
Figure 10B:
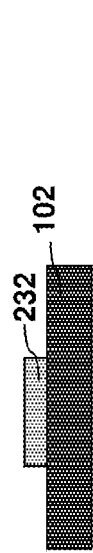
Figure 10C:
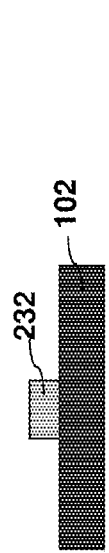

Referring to FIGS. 10A-10C, the final circuit pattern 232 is transferred to the patterning-target layer 104. An etch process is applied to the workpiece 100 using the patterned first hard mask 106 as an etch mask to transfer the final circuit pattern 232 to the patterning-target layer 104. In some embodiments, the regions that are not covered by the first hard mask 106 are removed using one or more etching processes, leaving the region(s) corresponding to the circuit pattern 232 remain in the patterning-target layer 104. In some embodiments, the one or more etching processes include a selective dry etch process, such as a plasma etching process, a selective wet etching process, or a combination thereof. In some embodiments, the etching process is designed to selectively etch the patterning-target layer 104 with a proper etchant, such as etching gases including at least one of $CF_4$, $CH_2F_2$, $CHF_3$, other suitable etching gases, or combinations thereof.

As noted above, the main pattern 202 in FIGS. 4A-4C may be alternatively defined in the first hard mask 106. In this case, the circuit pattern 232 is directly formed in the patterning-target layer 104 by an etching process using the spacer 212 and the main pattern 202 (that is defined in the first hard mask 106) as an etch mask. In this case, the operations associated with FIGS. 8A-8C and 10A-10C are alternatively replaced by one operation that directly selectively etches the patterning-target layer 104 using the spacer 212 and the main pattern 202 collectively as an etch mask. In this case, the operation may include one or more etching processes to selectively etch the patterning-target layer 104, thereby transferring the circuit pattern 232 to the patterning-target layer 104. In some embodiments, the one or more etching processes include a selective dry etch process, such as a plasma etching process, a wet etching process, or a combination thereof with a proper etchant. Afterward, the operation is used to remove the main pattern 202 and the spacer 212 by a suitable etch procedure, such as one similar to that illustrated in FIGS. 9A-9C. For example, the operation includes an etching procedure that further includes a first etching process to selectively etch the main pattern 202 and a second etching process to selectively etch the spacer 212 in either sequence.

Still referring to FIGS. 10A-10C, thus formed circuit pattern 232 includes a jog 234. Specifically, the circuit pattern 232 includes a first portion (such as the portion illustrated in FIG. 10B) having a first dimension CD1 and a second portion (such as the portion illustrated in FIG. 10C) having a second dimension CD2 different from the first dimension CD1. The difference between CD1 and CD2 is determined the spacer 212 and more specifically the horizontal thickness of the spacer 212 on the sidewalls of the main pattern 202. The second portion is also referred to as a jog. The disclosed method is capable of forming the circuit pattern 232 with a sharp jog without degrading the contour in the sharp corners around the jog. Furthermore, the recesses from both sides have dimensions Δ1 and Δ2, respectively. The dimensions Δ1 and Δ2 are same due to the characteristics of the method. In other words, the circuit pattern 232 is intrinsically symmetric. Compared with other multiple patterning methods to form the recesses, misalignment among the multiple patterning procedures causes recesses of both sides with different dimensions, therefore being non-symmetric. The disclosed method generates the circuit pattern with jog having an intrinsic symmetric structure. In term of fabrication cost, the disclosed method only includes one lithography process to define the main pattern and another lithography process to define the cut pattern.

The method described above may have other alternatives, changes and/or additions. For example, the cut pattern may be defined differently to form a different circuit pattern, such as a line feature with a non-symmetric jog. The cut process may be designed to selectively cut the main pattern in some embodiments. The main pattern may be designed with different geometry or defined in a different material layer. Various embodiments are further described below with reference to FIG. 15 and other figures.

Figure 15:
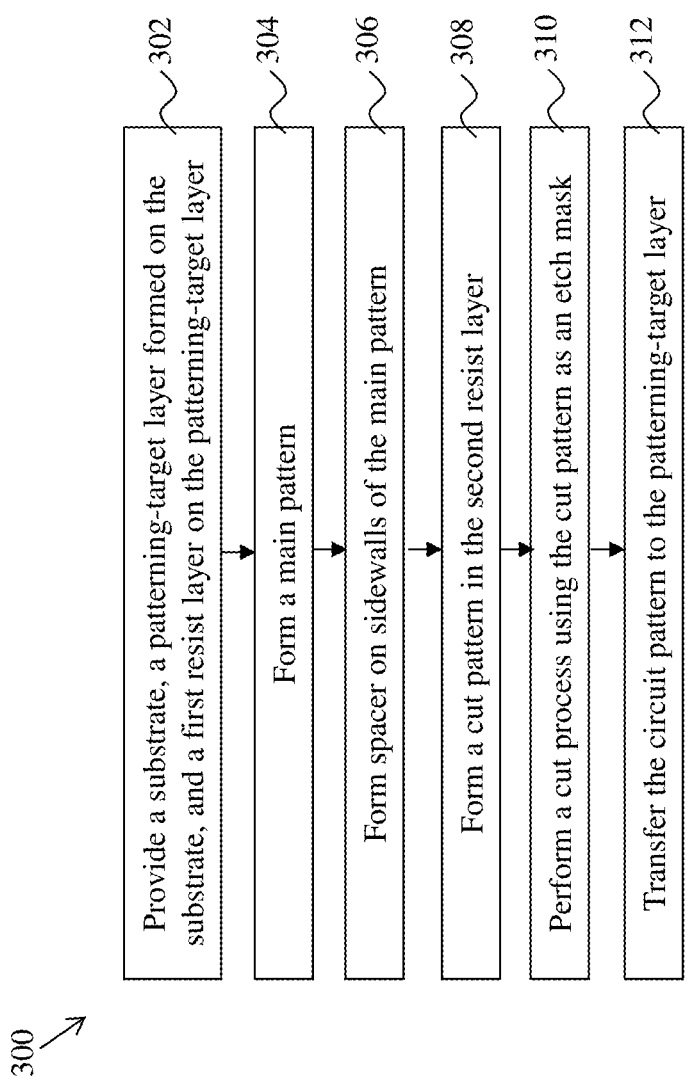
FIG. 15 is a flowchart showing a method of forming a circuit pattern in the semiconductor structure using multiple lithography processes, in accordance with some embodiments.
Figure 18D:
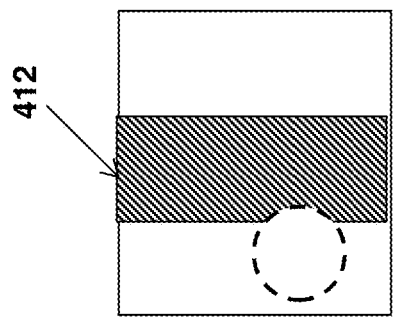
FIGS. 18A, 18B, 18C and 18D are top views of the semiconductor structure in various fabrication stages, constructed in accordance with some embodiments.
Figure 18C:
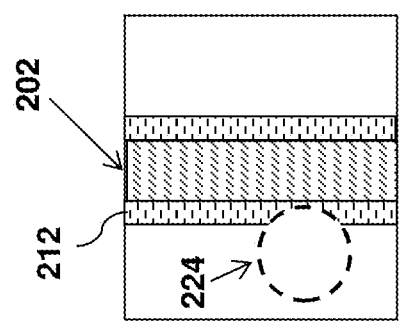
Figure 18B:
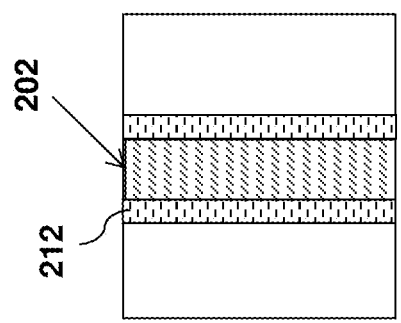
Figure 18A:
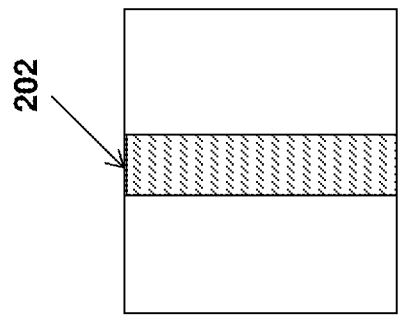

FIG. 15 illustrates a method 300 of forming patterns using multiple lithography processes in the semiconductor structure 100 as discussed with reference to FIGS. 2A-2C to 10A-10C. Method 300 starts from operation 302 by providing the substrate 102 and the patterning-target layer 104 disposed over the substrate 102. In some embodiments, the patterning-target layer 104 is formed by one or more processes selected from the group consisting of CVD, PVD, ALD, spin-on method, sputtering, thermal oxidation, and a combination thereof. Other materials are formed on over the patterning-target layer. In some embodiments, the first hard mask 106 is formed over the patterning-target layer 104 by a proper technique, such as CVD or PVD. In some embodiments, the hard mask layer 106 is formed by one or more processes selected from the group consisting of CVD, PVD, ALD, spin-on method, sputtering, thermal oxidation, and a combination thereof. In some embodiments, a first resist layer 108 is formed on the substrate 102, particularly on the first hard mask 106, using a spin-on coating method.

Method 300 proceeds to operation 304 by forming a main pattern 202. In some embodiments, the main pattern 202 includes one or more lines. In some embodiments, the main pattern 202 is first formed in the first resist layer 108 using a lithography process. In some examples, the lithography process includes exposing the first resist layer 108 to a light source, performing post-exposure bake processes, and developing the first resist layer 108. In some embodiment, the main pattern 202 is then transferred to the first hard mask 106 by one or more etching processes using the patterned first resist layer 108 as an etching mask. In furtherance of the embodiments, the first resist layer 108 is then removed by a wet stripping process, a plasma ashing process, and/or other suitable methods.

Method 300 proceeds to operation 306 by forming the spacer 212 on the sidewalls of the main pattern 202. In some embodiments, the spacer 212 includes a dielectric material (such as silicon oxide, silicon nitride or silicon oxynitride) or other suitable material. The formation of the spacer 212 includes deposition and anisotropic etch. The anisotropic etch includes a plasma etch or other suitable etch to substantially etch on the vertical direction toward substrate 102. The spacer 212 may be formed by other suitable technique, such as DSA or RELACS, in accordance with some embodiments.

Method 300 proceeds to operation 308 by forming a cut pattern in the second resist layer 222. In some embodiments, the cut pattern includes one or more trenches (also referred to as cut features) 224 as shown in FIGS. 5A-5C. In some embodiments, the cut pattern is formed using a lithography process. In some embodiments, the lithography process includes exposing the second resist layer 222 to a light source, performing post-exposure bake processes, and developing the second resist layer 222 to remove the regions corresponding to the cut feature 224 (e.g., a trench) in the second resist layer 222 as shown in FIGS. 5A and 5C.

Method 300 proceeds to operation 310 by performing a cut process using the cut pattern as an etch mask. Particularly, the cut process includes an etching process to selectively remove the portions of the spacer 212 within the trench 224. The etching process is designed to selectively etch the spacer 212 such that the portions of the spacer 212 within the trench 224 of the cut pattern is removed using the second resist layer 222 and the main pattern 202 as a collective etch mask. The etching process is designed to etch the spacer 212 with etch selectivity to the main pattern 202 and the second resist layer 222. In some embodiments, the etching process includes a selective dry etch process, such as a plasma etching process, a selective wet etching process, or a combination thereof. During the etching processes, the portions of the spacer 212 corresponding to the cut feature 224 is selectively removed, while the main pattern 202 remains unetched. In some embodiments, after the cut process, the second resist layer 222 is removed by a wet stripping process, a plasma ashing process, and/or other suitable methods. Thus, the main pattern 202 and the modified spacer 212 (as the portions of the spacer 212 are removed in the cut process) collectively define the circuit pattern 232 in the hard mask 106. The circuit pattern 232 includes a line with a sharp jog. In the present embodiment, the circuit pattern includes a line with a symmetric dent from both sides in the neck portion.

Method 300 proceeds to operation 312 by transferring the circuit pattern 232 to the patterning-target layer 104. In some embodiments, the patterning-target layer 104 is etched using the main pattern 202 and the modified spacer 212 as an etching mask. In some embodiments, the etching processes include a selective dry etch process, such as a plasma etching process, a selective wet etching process, or a combination thereof. During the etching processes, the portions of the patterning-target layer 106 uncovered by the main pattern 202 and the modified spacer 212 are selectively removed, thereby transferring the circuit pattern 232 to the patterning-target layer 104. In some embodiments, thereafter, the main pattern 202 and the modified spacer 222 are removed by one or more etching processes, such as dry etch, wet etch or a combination thereof.

The method described above may have other alternatives, changes and/or additions. For example, the cut pattern may be defined differently to form a different circuit pattern, such as a line feature with a non-symmetric jog. The cut process may be designed to selectively cut the main pattern in some embodiments. Various embodiments are further described below with reference with FIG. 16 and other figures.

FIGS. 16A-16D illustrates top views of the semiconductor structure 100 at various fabrication stages in accordance with some embodiments. The semiconductor structure 100 in FIGS. 16A-16D is same to that semiconductor structure 100 illustrated in FIGS. 2A-2C through 10A-10C. For example, FIG. 16A is similar to FIG. 3A where the main pattern 202 is formed by the operation 304; FIG. 16B is similar to FIG. 4A where the spacer 212 is formed by the operation 306; FIG. 16C is similar to FIG. 8A where the cut feature 224 is formed by the operation 308 and the spacer 212 is modified by a cut process in the operation 310; and FIG. 16D is similar to FIG. 10A where the circuit pattern 232 is transferred to the patterning-target layer 106 by the operation 312. FIGS. 16A-16D are provided here as a reference to introduce a semiconductor structure 400 and the method making the same, without repeating the similar descriptions. FIGS. 17A-17D illustrates top views of the semiconductor structure 400 at various fabrication stages in accordance with some embodiments. The method 300 is used to form the semiconductor structure 400. In the semiconductor structure 400, the cut pattern is formed by the operation 308. However, the cut feature (trench) 224 is designed with one end landing the main pattern 202 and extending over the spacer 212 in one side. Thus, the final circuit pattern 402 includes a line feature with a jog. Particularly, the circuit pattern 402 has a dent from one side and is non-symmetric.

FIGS. 18A-18D illustrates top views of the semiconductor structure 410 at various fabrication stages in accordance with some embodiments. The method 300 is used to form the semiconductor structure 410. In the semiconductor structure 410, the cut pattern is formed by the operation 308. However, the cut feature (trench) 224 is designed and positioned such that it partially lands over the spacer 212 in one side and is disposed a distance away from the main pattern 202. Thus, the final circuit pattern 402 includes a line feature with a jog. Particularly, the circuit pattern 402 has a dent from one side and is non-symmetric. The dent portion has a recess less than the full horizontal thickness of the spacer 212.

FIGS. 19A-19D illustrates top views of the semiconductor structure 420 at various fabrication stages in accordance with some embodiments. The method 300 is used to form the semiconductor structure 420. In the semiconductor structure 420, the cut pattern is formed by the operation 308. However, the cut feature (trench) 224 is designed and positioned such that it lands on the main pattern 202 and extends to the spacer 212. Furthermore, the cut process is designed to selectively etch the main pattern 202 while the spacer 212 remains unetched. Thus, the final circuit pattern 422 includes a line feature with an opening 424 within the line.

Particularly, the opening 424 has a dimension determined by the width of the main pattern 202.

FIGS. 20A-20D illustrates top views of the semiconductor structure 430 at various fabrication stages in accordance with some embodiments. The method 300 is used to form the semiconductor structure 430. In the semiconductor structure 420, the cut pattern is formed by the operation 308. However, the cut feature (trench) 224 is designed and positioned such that it lands on the main pattern 202. The one end of the cut feature 224 is disposed away from the spacer 212 on one side with an offset and another end of the cut feature 224 extends to the spacer 212 on another side. Furthermore, the cut process is designed to selectively etch the main pattern 202 while the spacer 212 remains unetched. Thus, the final circuit pattern 432 includes a line feature with an opening 434 within the line. Particularly, the opening 434 has a dimension determined by the overlap of the cut feature 224 with of the main pattern 202.

FIGS. 21A, 21B, and 21C through 29A, 29B, and 29C illustrate a semiconductor structure 500 in accordance with some embodiments. The semiconductor structure 500 is formed by the method 300. However, the main pattern is defined in one or more trenches in the semiconductor structure (also referred to as workpiece) 500. Similar features and the formation of the same are not repeated for simplicity.

Figure 21A:
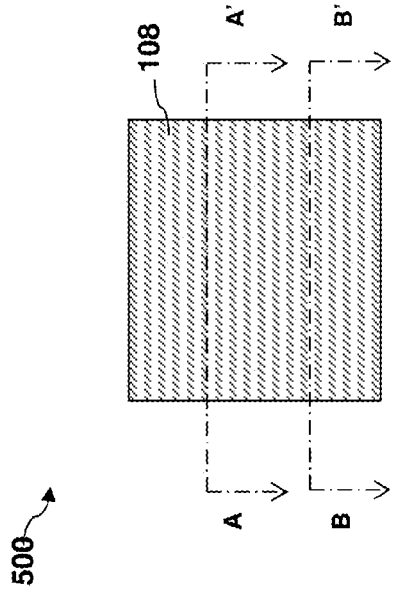
Figure 21B:
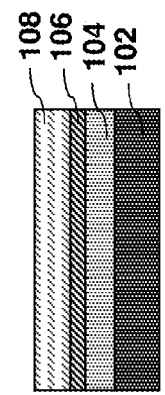
Figure 21C:
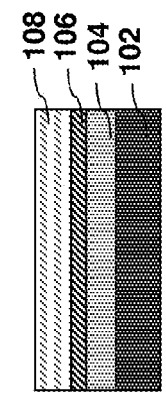

As illustrated in FIGS. 21A, 21B and 21C, a substrate 102, a patterning-target layer 104, and a first hard mask layer 106, a first resist layer 108 are provided in a semiconductor structure 100. In some embodiments, the substrate 102 is a semiconductor substrate, such as a semiconductor wafer. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as STI. The substrate 102 may further include various material layers, such as gate material layers.

Referring to FIGS. 21B and 21C, the patterning-target layer 104 is formed over the substrate 102. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, CVD, spin-on coating, PVD, ALD, thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Still referring to FIGS. 21B and 21C, a first hard mask layer 106 may be formed over the patterning-target layer 104. In some embodiments, the first hard mask layer 106 is a dielectric material layer to provide etch resistance and to function as an etch mask during an etching process. For example, the etching process can etch an underlying material layer through the openings of the first hard mask layer such that the openings are transferred to the underlying material layer. In some embodiments, the first hard mask layer 106 includes silicon oxide, silicon nitride, silicon oxynitride, or other suitable material. In some embodiments, the hard mask layer 106 includes titanium nitride (TiN). In some embodiments, the hard mask layer 106 has a thickness in a range from about 5 nm to about 50 nm. In some embodiments, the hard mask layer 106 is formed using one or more processes selected from the group consisting of CVD, PVD, ALD, spin-on method, and a combination thereof.

Still referring to FIGS. 21B and 21C, in order to pattern the patterning-target layer 104, the first resist layer 108 is formed over the patterning-target layer 104 (and the first hard mask layer 106 as well if present). The first resist layer 108 may be formed by a suitable technique, such as spin-on coating. In some embodiments, the first resist layer 108 is a photoresist layer including chemicals that are sensitive to light, such as UV light. In some embodiments, the first resist layer 108 can also be an electron-beam sensitive layer. In some embodiments, the first resist layer 108 is formed using a spin-on coating method. In some embodiments, the first resist layer 108 includes one or more organic polymer materials. In some embodiments, the first resist layer 108 has a thickness in a range from about 10 nm to about 100 nm.

Figure 22A:
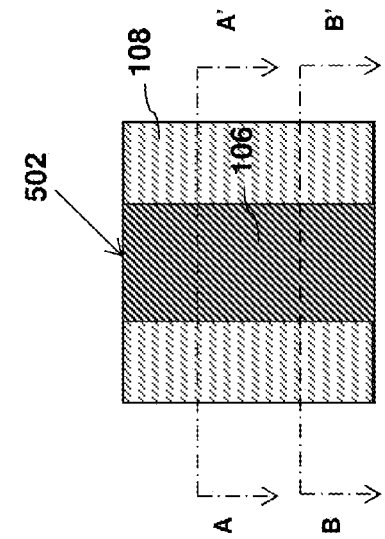
Figure 22B:
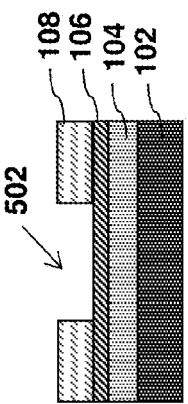
Figure 22C:
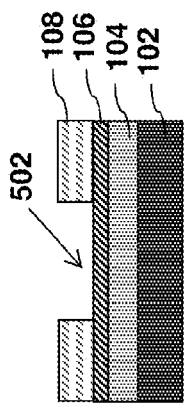

Referring to FIGS. 22A, 22B and 22C, a lithography process is performed to the first resist layer 108 to form a main pattern 502. Particularly, the main pattern 202 includes one or more main features defined in trench lines as shown in FIGS. 22A-22C. In some embodiments, the main pattern 502 is formed in the first resist layer 108. In some embodiments, the lithography process starts from exposing the first resist layer 108 to a light source using a photomask having the main pattern 202. In some embodiments, the main pattern 502 may include any other suitable features that can be formed using a lithography process.

In the present embodiment, the main pattern 502 is defined in the patterned first resist layer 108. In other embodiments, the main pattern 502 may be transferred to and defined in the first hard mask 106 by an etch process using the patterned first resist layer 108 as an etch mask. In this case, the first resist layer 108 may be removed after the main pattern 502 is transferred to the first hard mask 106. In the following description, when the main pattern 502 is referred, it may be defined in the first resist layer 108 in some embodiments or alternatively defined in the first hard mask 106 in other embodiments.

Referring to FIGS. 23A-23C, a spacer 212 is formed on the sidewalls of the main pattern 202. Particular, the spacer 213 is formed on the inner sidewalls of the trench 502. In some embodiments, the material of the spacer 212 may include any suitable semiconductor, semiconductor oxide, semiconductor nitride, semiconductor oxynitride, other dielectric, and/or other suitable material and may be selected to have different etchant sensitivity than the first hard mask layer 106 and the resist layer 108. For example, in an embodiment with a silicon oxide material layer 106, the spacer 212 fins include silicon nitride. In some embodiments when the main pattern 502 is defined in the first hard mask 106, the spacer 212 is formed on the sidewalls of the main pattern 502 defined in the first hard mask 106.

One technique for forming the spacer 212 on the sidewalls of the main pattern 502 without substantial spacer material remaining on the horizontal surfaces of the workpiece 500 includes deposition and anisotropic etching. In furtherance of the embodiments, a spacer material is deposited on the workpiece 500 by any suitable process including CVD, CVD, and/or other suitable deposition techniques. The anisotropic etching includes plasma etching in some embodiments. In various examples, the deposition thickness and the etching technique are tuned to control the horizontal thickness of the spacer 212. The thickness of the spacer 212 is correlated to the jog dimension of the main features to be formed in the patterning target material layer 104.

Alternatively, the spacer 212 may be formed by other suitable technique. In some embodiments, the spacer 212 is formed by a direct self-assembly (DSA) process. In some other embodiments, the spacer 212 is formed by resolution enhancement lithography by assist of chemical shrink (RELACS).

Referring to FIGS. 24A-24C, a second resist layer 222 is formed on the workpiece 500 and defines a cut pattern. The second resist layer 222 is formed by a photolithography process, such as a photolithography method similar to that used to form the patterned first resist layer 108. In one example, the method includes resist spin-on coating, exposing, post-exposure baking and developing. The cut pattern includes a cut feature 224, which is a trench (opening), defining a region to be trimmed by a cut process.

In some embodiments, the main pattern 502 is defined in the patterned first resist layer 108. The spacer 212 is formed on the sidewalls of the patterned first resist layer, and the second resist layer 222 is formed while the patterned first resist layer 108 is still present. Since the first resist layer 202 is present, the second resist layer 222 is different from the first resist layer 108. For example, the second resist layer 222 can be developed by a developing solution that will not develop the first resist layer.

In some other embodiments as noted above, the main pattern 502 is defined in the first hard mask 106 and the spacer 212 is formed on the sidewalls of the main pattern 202 (that is defined in the first hard mask 106). In this case, the second resist layer 222 is formed on the patterning-target layer 104 to define the cut feature.

Referring to FIGS. 25A-25C, a cut process is applied to remove the portions of the spacer 212 within the opening of the second resist layer 222. In other words, a cut process includes an etching process applied to cut portions of the spacer 212 defined by the cut feature. The etching process may include a wet etch, a dry etch, or any suitable etch with proper etch selectivity such that it selectively removes the spacer 212 using the second resist layer 222 and the main pattern 202 as a collective mask while the main pattern 202 remains unetched.

Referring to FIGS. 26A-26C, the second resist layer 222 is removed by a proper technique. In some embodiments, the second resist layer 222 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof.

Referring to FIGS. 27A-27C, an etching process is applied to the first hard mask 106 using the spacer 212 and the main pattern 502 as an etching, thereby forming a final circuit pattern 512 in the first hard mask 106. In some embodiments, the regions that are not covered by the main pattern 502 and the spacer 212 are removed using one or more etching processes, leaving the region(s) corresponding to the circuit pattern (collectively defined by both main pattern 502 and the spacer 212 as illustrated in FIG. 27A) remain in the first hard mask 106. In some embodiments, the one or more etching processes include a selective dry etch process, such as a plasma etching process, a selective wet etching process, or a combination thereof. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Referring to FIGS. 28A-28C, thereafter, the first resist layer 108 and the spacer 212 are removed by an etching procedure that includes one or more etching processes.

Figure 29A:
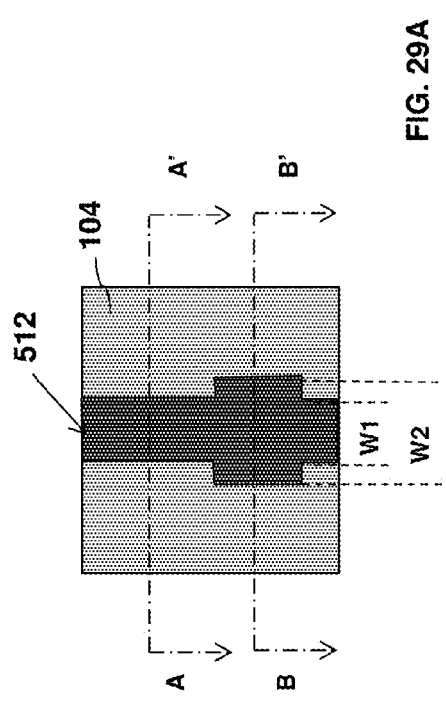
Figure 29B:
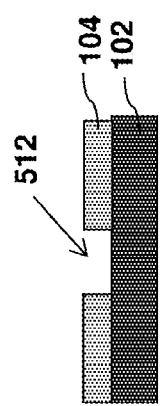
Figure 29C:
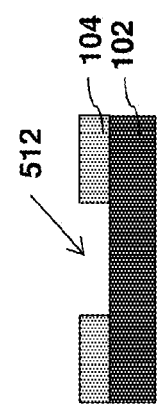
Figure 32D:
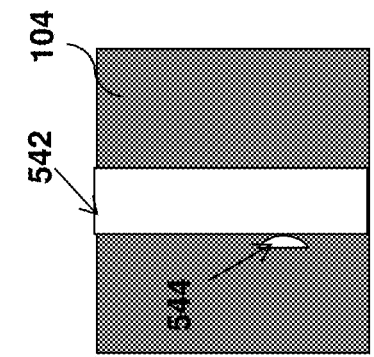
FIGS. 32A, 32B, 32C and 32D are top views of the semiconductor structure in various fabrication stages, constructed in accordance with some embodiments.
Figure 32C:
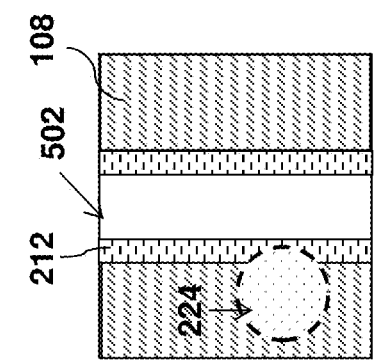
Figure 32B:
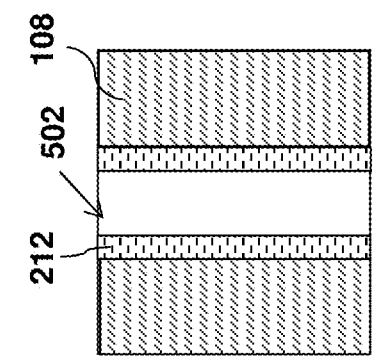
Figure 32A:
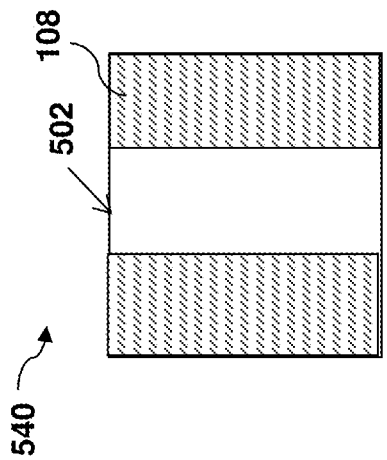

Referring to FIGS. 29A-29C, the final circuit pattern 512 is transferred to the patterning-target layer 104. An etch process is applied to the workpiece 100 using the patterned first hard mask 106 as an etch mask to transfer the final circuit pattern 232 to the patterning-target layer 104. In some embodiments, the regions that are not covered by the first hard mask 106 are removed using one or more etching processes, leaving the region(s) corresponding to the circuit pattern 232 remain in the patterning-target layer 104. In some embodiments, the one or more etching processes include a selective dry etch process, such as a plasma etching process, a selective wet etching process, or a combination thereof. In some embodiments, the etching process is designed to selectively etch the patterning-target layer 104 with a proper etchant, such as etching gases including at least one of $CF_4$, $CH_2F_2$, $CHF_3$, other suitable etching gases, or combinations thereof.

As noted above, the main pattern 502 in FIGS. 22A-22C may be alternatively defined in the first hard mask 106. In this case, the circuit pattern 512 is directly formed in the patterning-target layer 104 by an etching process using the spacer 212 and the main pattern 502 (that is defined in the first hard mask 106) as an etch mask. In this case, the operations associated with FIGS. 27A-27C and 29A-29C are alternatively replaced by one operation that selectively etches the patterning-target layer 104 using the spacer 212 and the main pattern 502 collectively as an etch mask. In this case, the operation may include one or more etching processes to selectively etch the patterning-target layer 104, thereby transferring the circuit pattern 512 to the patterning-target layer 104. In some embodiments, the one or more etching processes include a selective dry etch process, such as a plasma etching process, a wet etching process, or a combination thereof with a proper etchant. Afterward, the operation is used to remove the main pattern 502 and the spacer 212 by a suitable etch procedure, such as one similar to that illustrated in FIGS. 28A-28C. For example, the operation includes an etching procedure that further includes a first etching process to selectively etch the main pattern 502 and a second etching process to selectively etch the spacer 212 in either sequence.

Still referring to FIGS. 29A-29C, thus formed circuit pattern 512 includes a trench line with a sharp jog, or particularly a protruding portion. The trench line has a first dimension W1 (such as the portion illustrated in FIG. 29B) and the protruding portion has a second dimension W2 (such as the portion illustrated in FIG. 10C) greater than W1. The difference between W1 and W2 is determined the spacer 212 and more specifically the horizontal thickness of the spacer 212 on the sidewalls of the main pattern 502. Again, the disclosed method 300 forms the circuit pattern 512 with a sharp jog without degrading the contour in the sharp corners around the jog. Furthermore, the disclosed method only includes one lithography process to define the main pattern and another lithography process to define the cut feature.

FIGS. 30A-30D illustrates top views of the semiconductor structure 520 at various fabrication stages in accordance with some embodiments. The method 300 is used to form the semiconductor structure 520. In FIG. 30A, the main pattern 502 includes a trench line. In FIG. 30B, the spacer 212 is formed on the sidewalls of the trench line. In FIG. 30C, the cut process includes an etching process designed to selectively remove the spacer 212 within the opening (the cut feature 224) of the cut pattern. In FIG. 30D, the final circuit pattern 522 includes a trench line with a sharp jog. In other words, the trench line has a first portion having a first dimension and a second portion (associated with the cut feature) having a second dimension greater than the first dimension. The first dimension is determined by the main pattern 502 and the spacer 212 while the second dimension is determined by the main pattern 502.

FIGS. 31A-31D illustrates top views of the semiconductor structure 530 at various fabrication stages in accordance with some embodiments. The method 300 is used to form the semiconductor structure 530. In the semiconductor structure 530, the cut pattern is formed by the operation 308. However, the cut feature (trench) 224 is designed and positioned such that it lands over the spacer 212 in one side and is disposed a distance away from the spacer in another side of the main pattern 202. Thus, the final circuit pattern 532 includes a trench line with a jog. Particularly, the circuit pattern 532 has a protruding portion on one side and is non-symmetric. The protruding portion has a dimension determined by the horizontal thickness of the spacer 212.

FIGS. 32A-32D illustrates top views of the semiconductor structure 540 at various fabrication stages in accordance with some embodiments. The method 300 is used to form the semiconductor structure 540. In the semiconductor structure 540, the cut pattern is formed by the operation 308. However, the cut feature (trench) 224 is designed and positioned such that it partially lands over the spacer 212 in one side and is disposed a distance away from the main pattern 202. Thus, the final circuit pattern 542 includes a trench line and an additional opening 544, which is disposed a distance away from the trench line.

Figure 33:
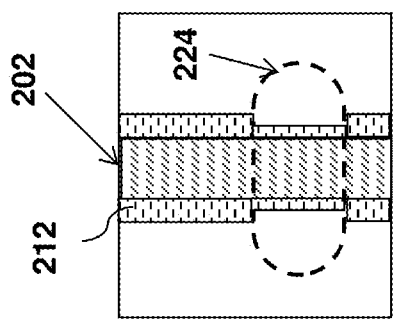
FIGS. 33 and 34 are top views of the semiconductor structure constructed in accordance with some embodiments.

The method 300 may further include other alternatives. Referring to FIG. 16C, the cut feature 224 is formed by the operation 308 and the spacer 212 is modified by a cut process in the operation 310. Particularly, the spacer 212 within the cut feature 224 is completely removed by a selective etching process while the main pattern within the cut feature 224 remains unetched. In an alternative embodiment illustrated in FIG. 33, the cut process includes an etching to be controlled (such as by controlling the etching duration) to remove only a portion (such as about 70% in term of the relative horizontal thickness) of the spacer 212 within the cut feature 224. Thus, the recess dimension in the jog portion is not only tunable by the horizontal thickness of the spacer 212 but also by the cut process (such as the etching duration). The corresponding cut process is referred to as an under-etch cut process.

Figure 34:
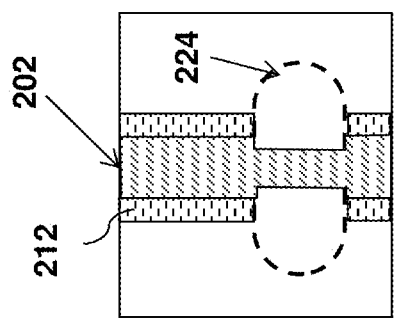

In another alternative embodiment illustrated in FIG. 34, the cut process does not only remove the spacer 212 but also the main pattern 202. In one example, the cut process includes a first etching process that selectively removes the spacer 212 and a second etching process that selectively removes the main pattern 202. The first etching process is applied such that the spacer 212 within the cut feature 224 is substantially removed. The second etching process is applied to the main pattern 202 in a controlled mode (e.g., by controlling the etching duration) such that the portion of the main pattern 202 within the cut feature 224 is only partially removed. In another example, the cut process includes an etching process that removes both the spacer 212 and the main pattern 202. By controlling the etching duration, the etching process is controlled such that the spacer 212 within the cut feature is completely removed and the main pattern 202 within the cut feature 224 is partially removed, such as illustrated in FIG. 34. Thus, the recess dimension in the jog portion is not only tunable by the horizontal thickness of the spacer 212 but also by the cut process (such as the etching duration). The corresponding cut process is referred to as an over-etch cut process.

FIG. 35 illustrates a method 550 of forming patterns using multiple lithography processes. The method 550 is similar to the method 300 but includes additional operations. The method 550 is described with further reference to the previous figures, such as FIGS. 2A-2C through 10A-10C. The method 550 starts from operation 302 by providing the substrate 102 and the patterning-target layer 104 disposed over the substrate 102. In some embodiments, the patterning-target layer 104 is formed by one or more suitable processes. Other materials are formed on over the patterning-target layer. In some embodiments, a hard mask 106 is formed over the patterning-target layer 104 by a proper technique.

Method 550 proceeds to operation 304 by forming a main pattern 202. In some embodiments, the main pattern 202 includes one or more lines. In some embodiments, the main pattern 202 is defined in the hard mask 106. In the present example for illustration, the main pattern 202 includes a line feature. The formation of the main pattern 202 in the hard mask 106 may include a lithography process and an etching process. Particularly, a first resist layer 108 is patterned using a lithography process. Then, the main pattern 202 is then transferred to the first hard mask 106 by one or more etching processes using the patterned first resist layer 108 as an etching mask. In furtherance of the embodiments, the first resist layer 108 is then removed by a wet stripping process, a plasma ashing process, and/or other suitable methods. In other examples, the main pattern 202 may be defined in the first resist layer 108.

Method 550 proceeds to operation 306 by forming the spacer 212 on the sidewalls of the main pattern 202. In some embodiments, the spacer 212 includes a dielectric material (such as silicon oxide, silicon nitride or silicon oxynitride) or other suitable material. The formation of the spacer 212 includes deposition and anisotropic etch. The anisotropic etch includes a plasma etch or other suitable etch to substantially etch on the vertical direction toward substrate 102. The spacer 212 may be formed by other suitable technique, such as DSA or RELACS, in accordance with some embodiments.

Method 550 proceeds to operation 308 by forming a first cut pattern in the second resist layer 222. In some embodiments, the first cut pattern includes one or more trenches (also referred to as cut features) 224 as shown in FIGS. 5A-5C. In some embodiments, the first cut pattern is formed using a lithography process.

Method 550 proceeds to operation 310 by performing a first cut process using the first cut pattern as an etch mask. Particularly, the cut process includes an etching process to selectively remove the portions of the spacer 212 within the trench 224. The etching process is designed to selectively etch the spacer 212 such that the portions of the spacer 212 within the trench 224 of the cut pattern is removed using the second resist layer 222 and the main pattern 202 as a collective etch mask. The etching process is designed to etch the spacer 212 with etch selectivity to the main pattern 202 and the second resist layer 222. In some embodiments, the etching process includes a selective dry etch process, such as a plasma etching process, a selective wet etching process, or a combination thereof. During the etching processes, the portions of the spacer 212 within the cut feature 224 are selectively removed, while the main pattern 202 remains unetched. In some embodiments, after the first cut process, the second resist layer 222 is removed by a wet stripping process, a plasma ashing process, and/or other suitable methods.

Method 550 proceeds to operation 552 by forming a second cut pattern in a third resist layer. In some embodiments, the second cut pattern includes one or more trenches (also referred to as cut features). The second cut pattern is similar to the first cut pattern in term of formation. For example, the second cut pattern is formed using another lithography process.

Method 550 proceeds to operation 554 by performing a second cut process using the second cut pattern as an etch mask. Particularly, the second cut process includes an etching process to selectively remove the portions of the main pattern 202 within the trench of the third resist layer. The etching process is designed to selectively etch the main pattern 202 such that the portions of the main pattern 202 within the trench of the second cut pattern is removed using the third resist layer and the spacer 212 as a collective etch mask. The etching process is designed to etch the main pattern 202 with etch selectivity to the spacer 212 and the third resist layer. In some embodiments, the etching process includes a selective dry etch process, such as a plasma etching process, a selective wet etching process, or a combination thereof. During the etching processes, the portions of the main pattern 202 corresponding to the second cut feature are selectively removed, while the spacer remains unetched. In some embodiments, after the second cut process, the third resist layer is removed by a wet stripping process, a plasma ashing process, and/or other suitable methods.

Thus, both the spacer 212 and the main pattern 202 are modified by the first and second cut processes, respectively. The processing sequence may be modifying the spacer 212 first and modifying the main pattern 202 thereafter, as described above. Alternatively. The processing sequence may be modifying the main pattern 202 first and modifying the spacer 212 thereafter. The final circuit pattern is defined by both the modified main pattern 202 (by the second cut process) and the modified spacer 212 (by the first cut process).

Method 550 proceeds to operation 312 by transferring the circuit pattern to the patterning-target layer 104. In some embodiments, the patterning-target layer 104 is etched using the modified main pattern 202 and the modified spacer 212 as a collective etching mask. In some embodiments, the etching processes include a selective dry etch process, such as a plasma etching process, a selective wet etching process, or a combination thereof. During the etching processes, the portions of the patterning-target layer 106 uncovered by the modified main pattern 202 and the modified spacer 212 are selectively removed, thereby transferring the circuit pattern 232 to the patterning-target layer 104. In some embodiments, thereafter, the modified main pattern 202 and the modified spacer 222 are removed by one or more etching processes, such as dry etch, wet etch or a combination thereof.

In another embodiment, the operation 552 includes a procedure to form a second cut pattern described as below. The operation 552 includes plugging a plug material layer to fill the opening 224 of the cut pattern; thereafter selectively removing the second pattern resist layer 222 while the plug material within the opening remain unetched; and selectively removing portions of the main pattern uncovered by the plug material. In some example, the plugging material includes a polymer material. The plugging of the plug material includes spin-on coating and curing. Thus formed second cut pattern is complimentary to the first cut pattern.

The method described above may have other alternatives, changes and/or addition. For example, the cut pattern may be defined differently to form a different circuit pattern, such as a line feature with a non-symmetric jog. The cut process may be designed to selectively cut the main pattern in some embodiments. The main pattern may be designed with different geometry or defined in a different material layer.

The present embodiments describe one or more manufacturable and low-cost mechanisms for forming a circuit pattern in semiconductor devices using multiple lithography processes. Especially, the circuit pattern formed thereby includes a feature with a sharp jog in accordance to various embodiments. The rounding corner or other degradation of the circuit pattern is substantially reduced with minimized fabrication cost. The mechanisms involve forming a main pattern and a spacer, and further include performing a cut process that selectively removes one of the main pattern and the spacer within the cut feature. The mechanisms enable forming patterns in a semiconductor device with sharp and clear edges and free of "rounding issues".

The disclosed method is used to but not limited to form one transistor, such as a metal-oxide-semiconductor field-effect-transistor (MOSFET), a fin field-effect-transistor (FinFET), a memory device, such as Static random-access memory (SRAM) or Dynamic random-access memory (DRAM), or other circuit structures having sharp jogs.

The present disclosure provides a method for forming patterns in a semiconductor device. In accordance with some embodiments, the method includes forming a main pattern on a substrate; forming a spacer on sidewalls of the main pattern; forming a cut pattern having an opening by a first lithography process; and performing a cut process to selectively remove portions of the spacer within the opening of the cut pattern while the main pattern remains unetched, thereby defining a circuit pattern by the main pattern and the spacer. The circuit pattern includes a sharp jog.

The present disclosure provides yet another embodiment of a method for forming patterns in a semiconductor device. In accordance with some embodiments, the method includes forming a main pattern on a substrate; forming a spacer on sidewalls of the main pattern; forming a cut pattern having an opening; performing an etch process to selectively remove portions of the main pattern within the opening of the cut pattern while the spacer remains unetched; and etching the substrate using the main pattern and the spacer as a collective etch mask, thereby forming a circuit pattern defined by the main pattern and the spacer.

The present disclosure provides yet another embodiment of a method for forming patterns in a semiconductor device. In accordance with some embodiments, the method includes forming a main pattern on a substrate; forming a spacer on sidewalls of the main pattern; forming a cut pattern having an opening; and performing a cut process to selectively remove only one of the spacer and the main pattern within the opening of the cut pattern, thereby defining a circuit pattern by the main pattern and the spacer, wherein the circuit pattern having a sharp jog.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming patterns in a semiconductor device, comprising:
   forming a main pattern on a substrate;
   forming a spacer on sidewalls of the main pattern;
   forming a first cut pattern having a first opening by a first lithography process;
   performing a first cut process to selectively remove portions of the spacer within the first opening of the first cut pattern while the main pattern remains unetched, thereby defining a circuit pattern by the main pattern and the spacer, wherein the circuit pattern includes a sharp jog; and
   transferring the circuit pattern to a patterning-target layer on the substrate by an etching process that selectively removes the patterning-target layer using the main pattern and the spacer as an etch mask.

2. The method of claim 1, further comprising forming a hard mask on the substrate, wherein the forming of the main pattern includes
   forming a patterned resist layer on the hard mask by a second lithography process, the patterned resist layer defining the main pattern; and
   transferring the main pattern to the hard mask by an etching process to selectively remove the hard mask using the patterned resist layer as an etch mask.

3. The method of claim 2, wherein the forming of the spacer includes depositing a material layer on the substrate; and performing an anisotropic etching process to the material layer, and wherein the depositing of the material layer includes depositing on a first sidewall and second sidewall of the main feature; and
   the performing of the anisotropic etching process includes anisotropically etching the material layer to form a first side spacer on the first sidewall and a second side spacer on the second sidewall of the main feature.

4. The method of claim 3, wherein the forming of the first cut pattern includes forming the first cut pattern such that the first opening is positioned to include portions of the first side spacer, the main pattern and the second side spacer.

5. The method of claim 1, wherein the forming of the spacer includes performing a direct self-assembly process to form the spacer on sidewalls of the main pattern.

6. The method of claim 1, wherein the forming of the spacer includes forming the spacer by resolution enhancement lithography by assist of chemical shrink (RELACS).

7. The method of claim 1, wherein
   the forming of the main pattern includes forming a main pattern having a line feature; and
   the forming of the spacer includes forming the spacer on sidewalls of the line feature of the main pattern.

8. The method of claim 1, wherein
   the forming of the main pattern includes forming a main pattern having a trench; and
   the forming of the spacer includes forming the spacer on sidewalls of the main pattern within the trench.

9. The method of claim 1, further comprising:
   forming a second cut pattern having a second opening by a second lithography process; and
   performing a second cut process to selectively remove portions of the main pattern within the second opening of the second cut pattern while the spacer remains unetched.

10. The method of claim 9, wherein the forming of the second cut pattern includes:
    plugging a plug material layer to fill the opening of the cut pattern after the performing of the cut process to selectively remove portions of the spacer within the opening of the cut pattern; and
    thereafter selectively removing the first pattern resist layer while the plug material within the opening remain unetched.

11. A method, comprising:
    forming a main pattern on a substrate;
    forming a spacer on sidewalls of the main pattern;
    forming a cut pattern having an opening;
    performing an etch process to selectively remove portions of the main pattern within the opening of the cut pattern while the spacer remains unetched; and
    etching the substrate using the main pattern and the spacer as a collective etch mask, thereby forming a circuit pattern defined by the main pattern and the spacer.

12. The method of claim 11, wherein the etching of the substrate includes transferring the circuit pattern to a patterning-target layer of the substrate by an etching process that selectively removes the patterning-target layer uncovered by the main pattern and the spacer.

13. The method of claim 11, further comprising forming a hard mask on the substrate, wherein the forming of the main pattern includes
    forming a patterned resist layer on the hard mask by a first lithography process, the patterned resist layer defining the main pattern; and
    transferring the main pattern to the hard mask by an etching process to selectively remove the hard mask using the patterned resist layer as an etch mask.

14. The method of claim 11, wherein the forming of the spacer includes depositing a material layer on the substrate; and performing an anisotropic etching process to the material layer, and wherein the depositing of the material layer includes depositing on a first sidewall and second sidewall of the main feature; and
    the performing of the anisotropic etching process includes anisotropically etching the material layer to form a first side spacer on the first sidewall and a second side spacer on the second sidewall of the main feature.

15. The method of claim 11, wherein the forming of the spacer includes forming the spacer by one of a direct self-assembly process and resolution enhancement lithography by assist of chemical shrink (RELACS).

16. The method of claim 11, wherein
    the forming of the main pattern includes forming a main pattern having a trench; and
    the forming of the spacer includes forming the spacer on sidewalls of the main pattern within the trench.

17. The method of claim 11, further comprising:
    forming a second cut pattern having a second opening; and
    performing a second cut process to selectively remove portions of the spacer within the second opening of the second cut pattern while the main pattern remains unetched.

18. The method of claim 17, wherein the forming of the second cut pattern includes
    plugging a plug material layer to fill the opening of the cut pattern after the performing of the cut process to selectively remove portions of the spacer within the opening of the cut pattern; and thereafter selectively removing the first pattern resist layer while the plug material within the opening remain unetched, defining the second cut pattern.

19. A method, comprising:

forming a main pattern on a patterning-target layer on a substrate;

forming a spacer on sidewalls of the main pattern;

forming a cut pattern having an opening;

performing a cut process to selectively remove only one of: a portion of the spacer or a portion of the main pattern within the opening of the cut pattern, thereby defining a circuit pattern by remaining portions of the main pattern and the spacer; and transferring the circuit pattern to the patterning-target layer by a selective etching process using the circuit pattern as an etch mask.

20. The method of claim 19, wherein the main pattern is a resist pattern or a hard mask pattern.

* * * * *